(12) United States Patent
Derhacobian et al.

(10) Patent No.: US 6,188,606 B1
(45) Date of Patent: Feb. 13, 2001

(54) MULTI STATE SENSING OF NAND MEMORY CELLS BY VARYING SOURCE BIAS

(75) Inventors: Narbeh Derhacobian, Belmont; Hao Fang, Cupertino; Michael Han, San Jose, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/369,600

(22) Filed: Aug. 6, 1999

(51) Int. Cl.[7] .................................................. G11C 16/04
(52) U.S. Cl. ................. 365/185.17; 365/185.18; 365/185.21; 365/185.3
(58) Field of Search ........................ 365/185.17, 185.18, 365/185.21, 185.3

(56) References Cited

U.S. PATENT DOCUMENTS

| | | | |
|---|---|---|---|
| 5,521,865 | 5/1996 | Ohuchi et al. | 365/185.22 |
| 5,748,546 | 5/1998 | Bauer et al. | 365/210 |
| 5,751,634 | 5/1998 | Itoh et al. | 365/185 |
| 5,877,980 | 3/1999 | Mang et al. | 365/185.17 |
| 5,946,231 | 8/1999 | Endoh et al. | 365/185.03 |
| 5,953,255 | 9/1999 | Lee | 365/185.29 |
| 5,973,957 | 10/1999 | Tedrow | 365/185.03 |

*Primary Examiner*—David Nelms
*Assistant Examiner*—Connie C. Yoha
(74) *Attorney, Agent, or Firm*—Skjerven Morrill MacPherson LLP

(57) ABSTRACT

A method and circuit for sensing multi states of a NAND memory cell by varying source bias, at a constant gate voltage, preferably zero volts, generating a memory cell current in response to the source bias, and sensing the memory cell state.

4 Claims, 5 Drawing Sheets

MULTI STATE SENSING OF NAND MEMORY CELLS BY VARYING SOURCE BIAS

FIELD OF THE INVENTION

The present invention relates to NAND memory cells used in non-volatile flash memory architecture. More specifically, it relates to sensing multi-levels in a NAND memory cell by applying a source bias voltage.

BACKGROUND OF THE INVENTION

A conventional NAND EEPROM (Electrically erasable programmable read only memory) array block is formed by a series of floating gate transistors coupled in series between a select drain transistor and a select source transistor. The select drain transistor is coupled to a data transfer line called bit line (BL) and the select source transistor is coupled to a source line. Each floating gate transistor is a memory cell having a floating gate which is programmed and erased using techniques well known to one skilled in the art. The memory cell transistors are floating gate MOSFETs (Metal Oxide Semiconductor Field Effect Transistors).

Conventionally, prior to programming the floating gate of a memory cell is biased to a negative voltage relative to the substrate by storing electrons into the floating gate. A floating gate of a memory cell is then programmed by turning the select source and drain transistors off to isolate the series of memory cells, biasing a control gate at the programming voltage, and grounding the body region. The substrate is biased, while the control gate is grounded, thereby driving the electrons from the floating gate back into the substrate.

Each NAND memory cell can be programmed into one of several states which can be designated, for example as follows:

(0,0) denotes an erased state;
(0,1) denotes a partially erased state;
(1,0) denotes a partially programmed state; and
(1,1) denotes a programmed state.

Currently, several reference voltages (Vref1, Vref2 and Vref3) are applied to NAND memory cells for sensing the state of a memory cell. The reference voltage and the state of the memory cell determine a cell current in a sensing circuit. For example a memory cell is conductive when erased, and hence pulls down the sense node. If the memory cell is programmed then it is not conductive and the sense node is pulled up. The state of the memory cell can be determined by analyzing the variation in the current in the sensing circuit caused by applying a reference voltage. "A Non-Volatile semiconductor memory device for storing multivalue data and readout/write-in method" is disclosed in U.S. Pat. No. 5,751,634. (Itoh). Similar to the method described above, in Itoh, reference voltages are applied at individual memory cells during data writing and data readout time, generating memory cell current in response to the reference voltages. The variation in memory cell currents provide the state of the memory cell. The disadvantage of Itoh is that when high reference voltages are applied to a memory cell, the reference voltage may cause disturbance in memory cells adjacent to the memory cell that is sensed at a given time.

Another method to sense the state of a NAND memory cell is by applying an external bias current at 0v and evaluating a cell current generated in response to the external bias current. The disadvantage of such a method is that only two states (0,0) and (1,1) can be sensed.

Therefore, what is desired is a circuit and a method that efficiently senses the levels of a multi state NAND memory cell without causing significant disturbance to memory cells adjacent to the memory cell sensed at any given time.

SUMMARY OF THE INVENTION

The present invention is a method and circuit for sensing the state of a multi-state NAND memory cell in a NAND string connected to a bit line by defining plural NAND memory cell states, applying a source bias voltage at the source terminal, at zero gate voltage and detecting a cell current in response to the applied source bias voltage. Finally, sensing the NAND memory cell state by measuring the cell current in response to the source bias voltage. The source bias generates reverse and forward voltage.

The present invention has the advantage of sensing plural states of NAND memory cells at zero gate voltage and hence minimizes any disturbance due to various reference voltages applied to NAND memory cells.

DETAILED DESCRIPTION OF THE INVENTION

Figure 1:
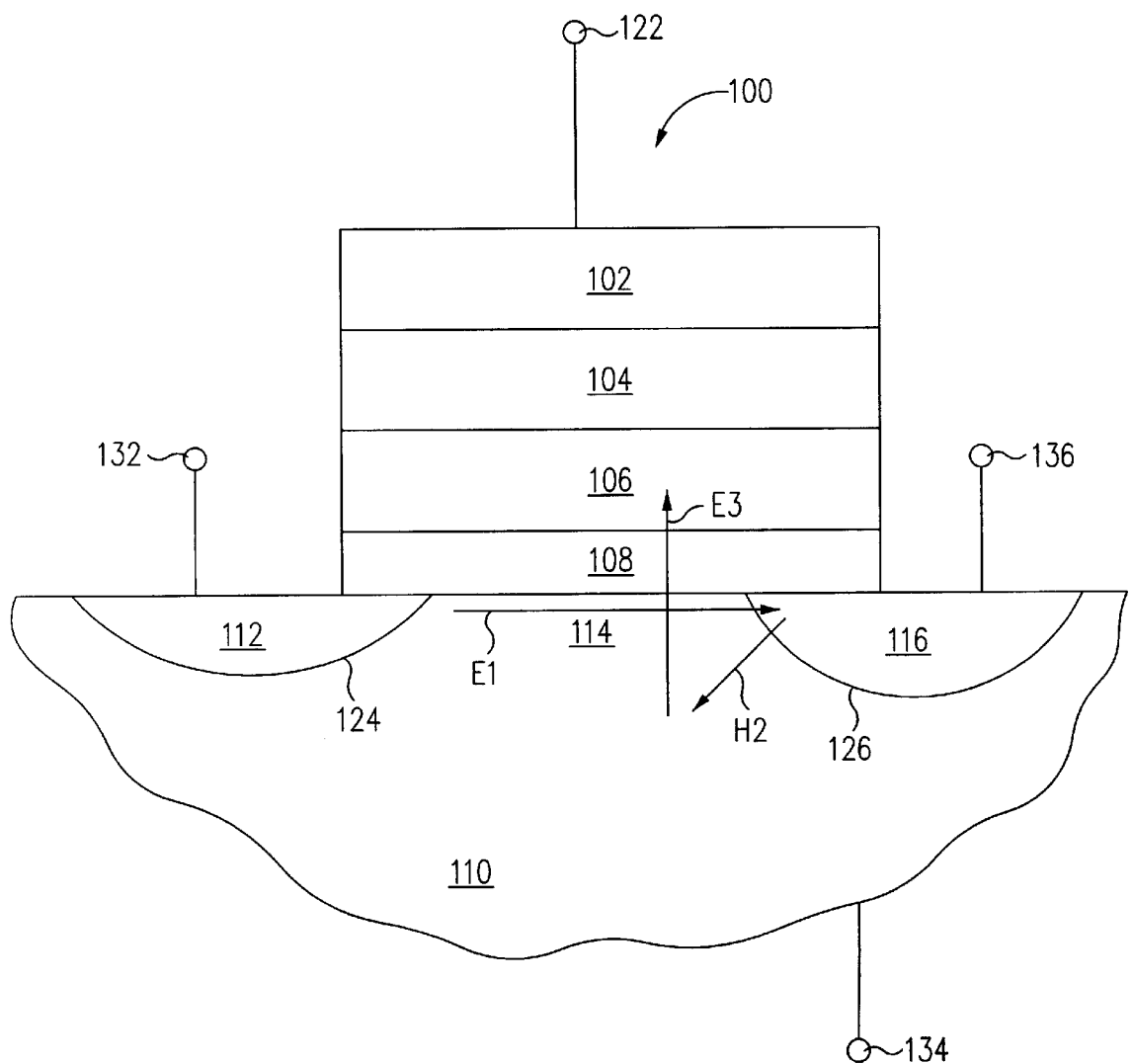
FIG. 1 is a cross sectional diagram of a floating type memory cell.

FIG. 1 is a cross-sectional diagram of a floating gate memory cell 100 of a NAND array block. Memory cell 100 is a floating gate transistor having a control gate 102 coupled to a voltage line 122 for applying a voltage of $V_g$ on control gate 102. Control gate 102 is separated from a floating gate 106 by an upper insulating layer 104, the floating gate 106 being separated from a substrate 110 by a lower insulating layer 108.

Substrate 110 includes an n+ source region 112 coupled to a voltage line 132 for applying a voltage of $V_s$ on n+ source region 112, a p-doped body region 114 coupled to a voltage line 134 for inducing a voltage on p-doped body region 114, and an n+ drain region 116 coupled to a voltage line 136 for applying a voltage of $V_D$ on n+ drain region 116.

Figure 2:
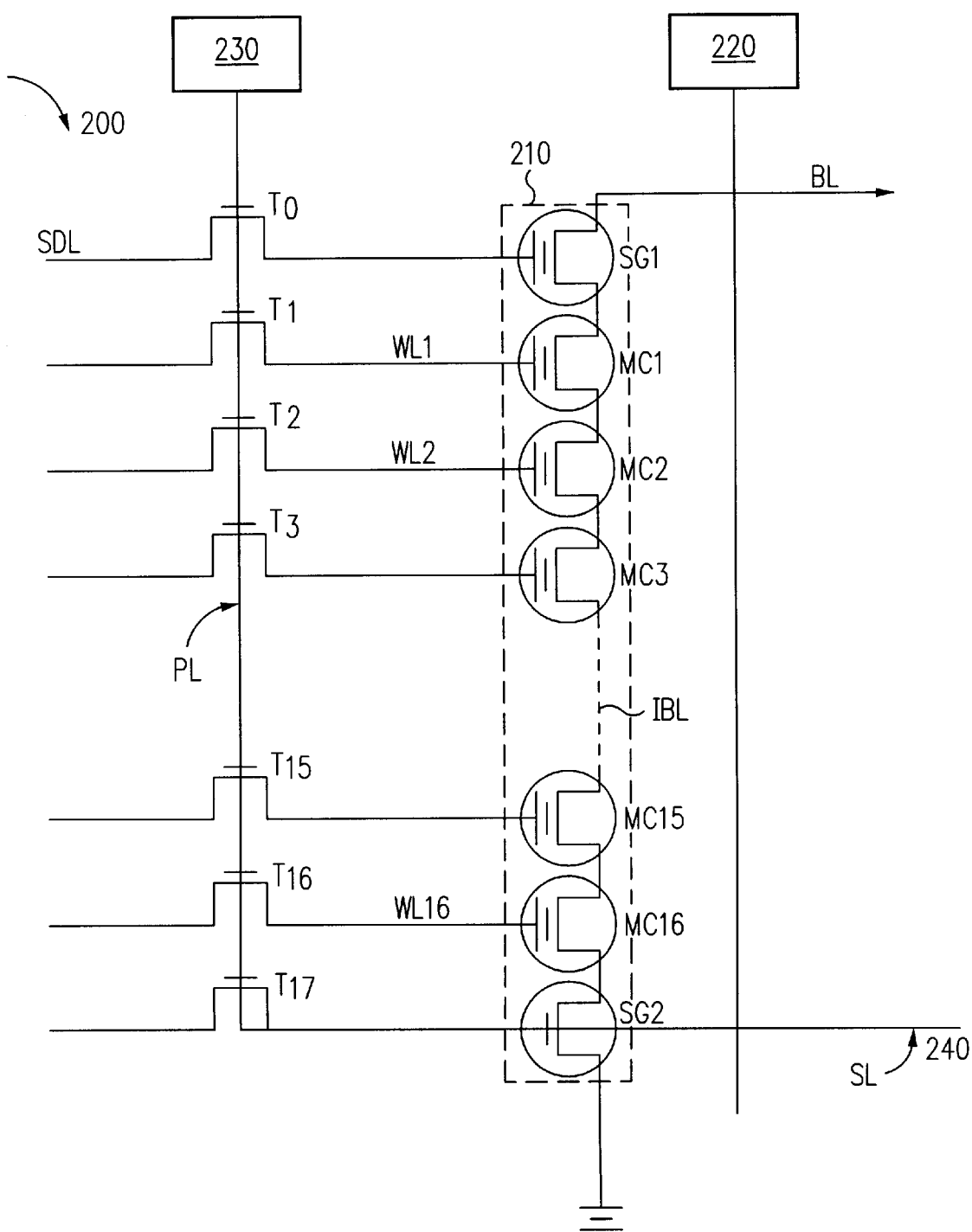
FIG. 2 is a schematic diagram of a NAND array block.

FIG. 2 is a schematic diagram of a conventional NAND array block 200. Block 200 includes an external bit line BL coupled to a sense circuit 220 for detecting a voltage change on external bit line BL. Select drain transistor SG1 couples bit line BL to string 210 while string 210 includes select drain transistor SG1 and internal bit line IBL coupled in series between external bit line BL and a source line 240.

Internal bit line IBL connects a NAND structure of 16 floating gate memory cells MC1 to MC16 connected in series between select gate transistors SG1 and SG2.(for clarity reasons, only memory cells MC1 to MC3 and MC15 to MC16 are shown in FIG. 2). Other configurations of 4, 16 or 32 memory cells may also be used. Memory cell MC3 can be implemented by memory cell 100 of FIG. 1. One terminal of memory cell MC16 in the string 210 is coupled to select source transistor SG2 that is connected to source line 240.

Each control gate of memory cells MC1 to MC16, WL1 to WL16 is coupled to a pass transistor (one of transistors T1 to T16) while the control gate of select drain transistor SD is coupled by transistor TO to select drain line SDL. Each of transistors To to T17 is coupled to charge pump 230 by pump line PL for applying voltages on lines SDL and WL1 to WL16 to the respective control gates of select drain transistor SG1 and SG2, and memory cells MC1 to MC16.

Figure 3:
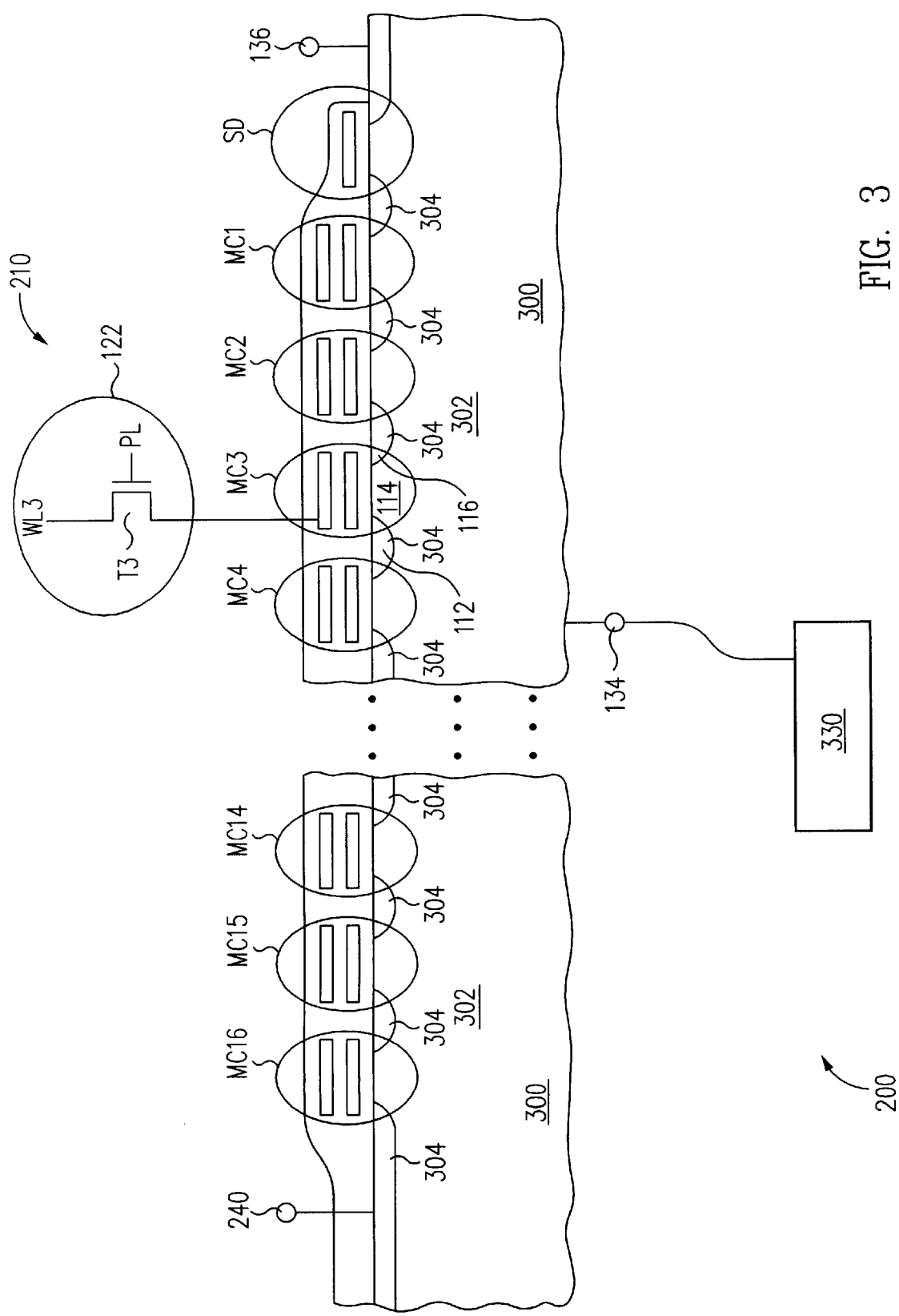
FIG. 3 is a cross sectional diagram of the string of FIG. 2 as disposed on a substrate.

FIG. 3 is a cross sectional diagram of string 200 of FIG. 2 as disposed on a substrate 300. Memory cells MC1 to MC16, of which, for clarity reasons, only memory cells MC1 to MC4 and MC14 to MC16 are shown in FIG. 3, are fabricated on a substrate 300.

Substrate 300 includes a p-well region 302, which is a body region for memory cells MC1 to MC16. P-well region 302 is coupled to voltage line 134 for asserting voltage $V_{pw}$ on p-well region 302. Substrate 300 also has n+ regions 304 which form n+ source and drain regions of memory cells MC1 to MC16.

Figure 4A:
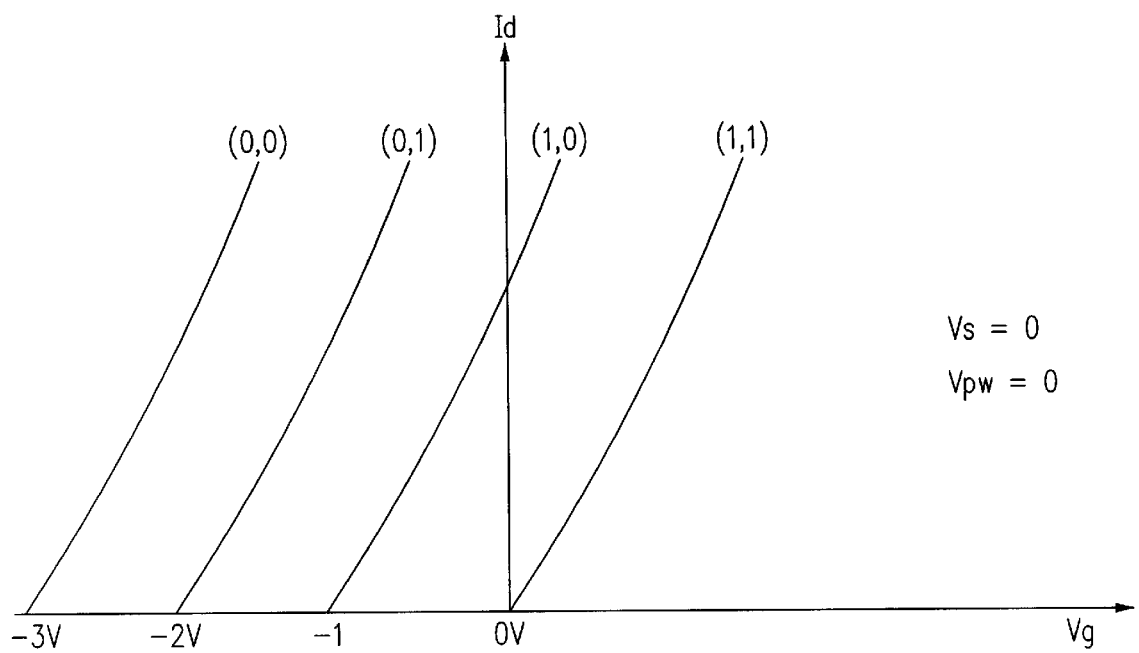
FIG. 4a is a diagram showing four states of a NAND memory cell.

FIG. 4a is a graphical representation of the four states of a memory cell as a function of Id (cell current) and gate voltage $V_g$ where the source voltage $V_s$ and the P well back bias ($V_{pw}$) is zero and external bias on the bit line BL is constant.

Figure 5:
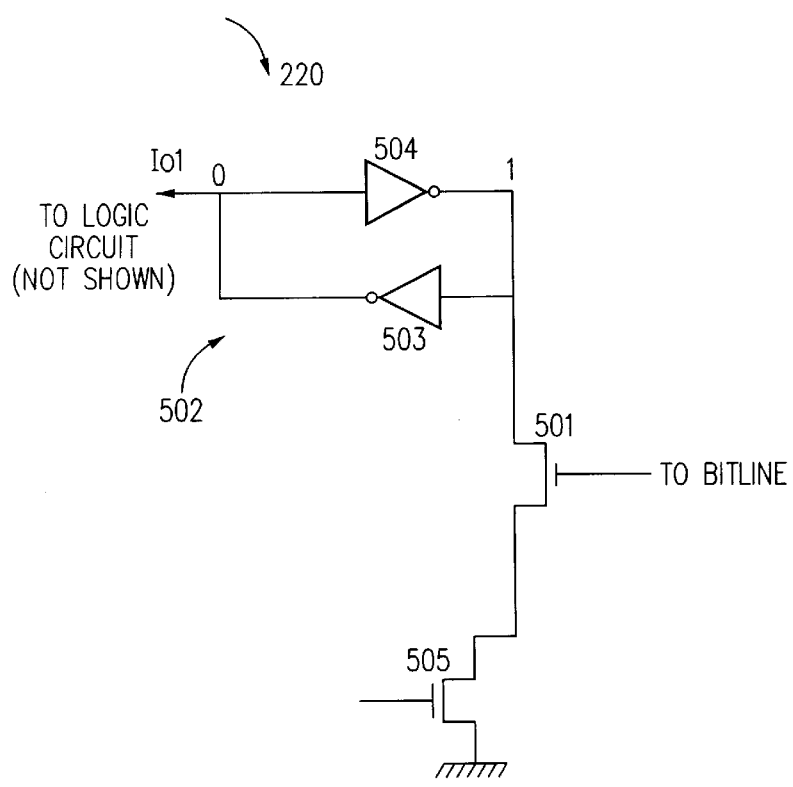
FIG. 5 shows a NAND cell sensing circuit of the present invention.

FIG. 5 is a circuit diagram that senses multi levels of NAND memory cells according to the present invention. The circuit includes a sense node 501, that senses variations in NAND memory cell current, a flip-flop latch 502 with gates 503 and 504 preconditioned to states 0 and 1, and a pulse source 505 generates reverse and forward bias voltage. For illustration purposes memory cell MC3 is sensed at a given time t.

A fixed gate voltage ($V_g$) of 0V is applied to cell MC3 at time t. $V_{pw}$ is at zero volts and voltage on external bit line BL is kept constant. $V_s$ is varied and that varies the memory cell current Id, depending upon memory cell MC3's state. If memory cell MC3 is in an erased state, it is conductive and if memory cell MC3 is programmed, then it is not conductive.

Figure 4B:
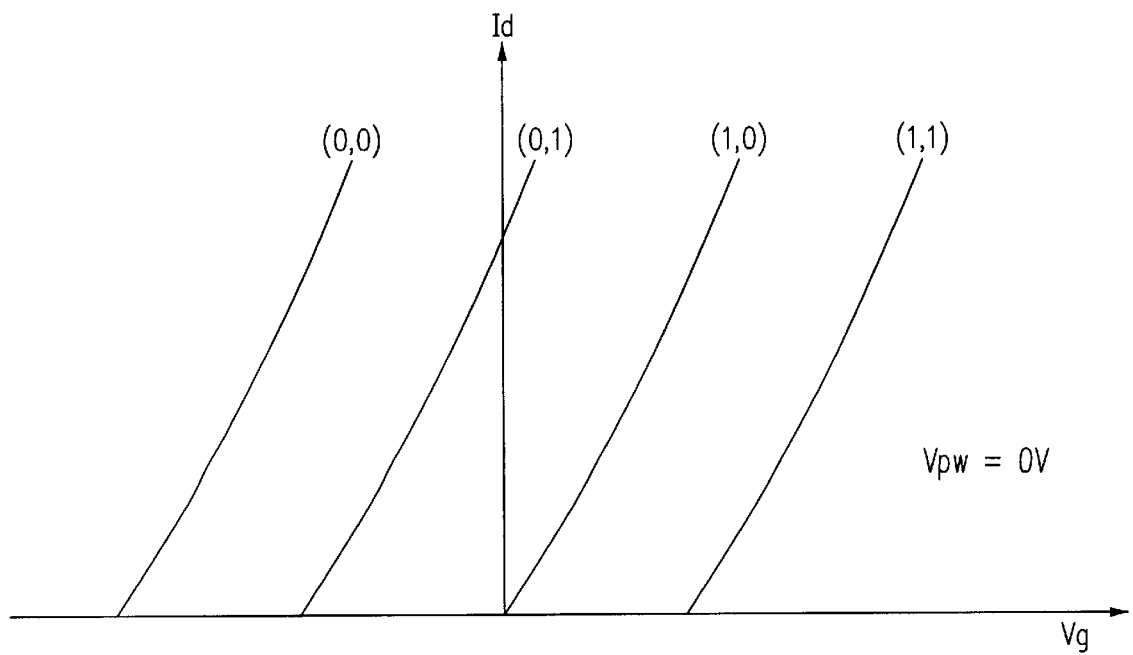
FIGS. 4b and 4c are the I-V characteristic of a NAND memory cell at zero gate voltage.
Figure 4C:
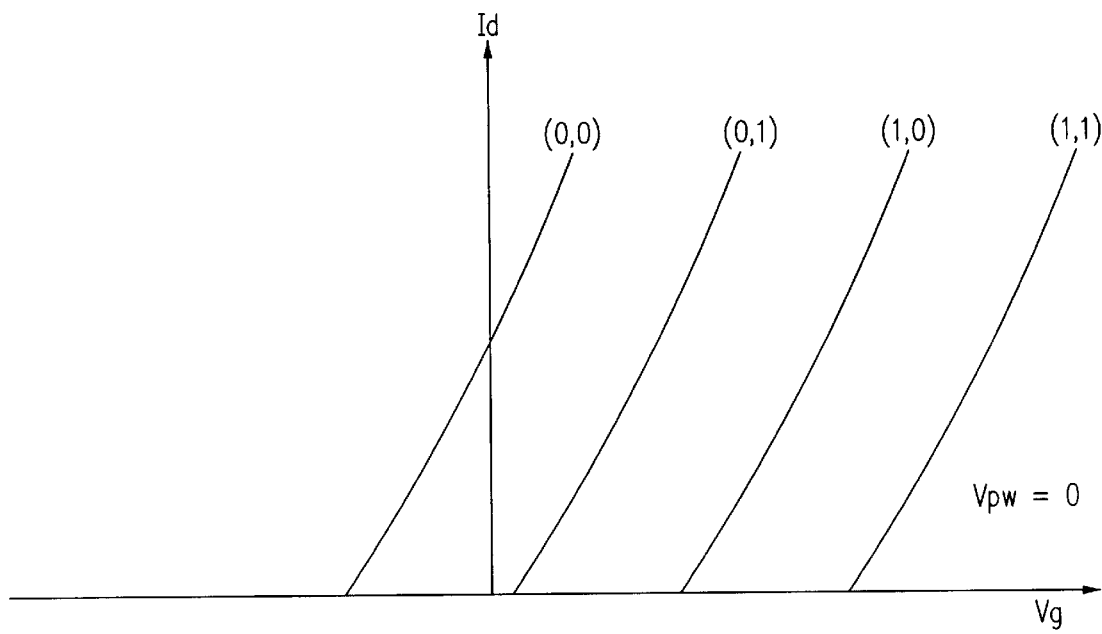

FIG. 4b shows the I-V characteristic of memory cell MC3 when a negative $V_s$ is applied at zero gate voltage, zero $V_{pw}$ and a fixed external bit line voltage. $V_s$ causes a shift of the IV characteristics in the positive direction along the voltage axis and thus differentiates between states (0,0), (0,1) and states (1,0) (1,1), since a current Id only flows in states (0,0) and (0,1) at zero gate voltage. FIG. 4c shows the I-V characteristic of memory cell MC3 when a positive $V_s$ is applied at zero gate voltage, zero $V_{pw}$ and fixed external bit line bias voltage. In this case, $V_s$ causes a further shift of the I-V characteristic curves in the positive direction along the voltage axis and differentiates between states (0,0) and (0,1) since current Id flows only in state (0,0). Hence the four states of memory cell MC3 are differentiated and sensed by applying plural $V_s$.

Memory cell MC3 generates a cell current as a result of its memory cell state and the value of $V_s$. If memory cell MC3 is conductive, it is in an erased state and pulls down sense node 501. The flip-flop latch circuit 502 stays in the same condition (0,1). If memory cell MC3 is programmed, it does not conduct and pulls up sense node 501, generating a signal that flips the flip-flop 502 to a 1,0 state. An output signal Io1 from the flip-flop 502 circuit is sent to a logic circuit (not shown). The output signal will vary with the cell current Id that varies with applied $V_s$ and the state of memory cell MC3.

Based upon the output signals from the flip-flop circuit, particular memory cell state is determined. The process is repeated at pre-determined intervals for every memory cell in the NAND array.

Although the present invention has been described with reference to specific embodiments, these embodiments are illustrative only and not limiting. Many other applications and embodiments of the present invention will be apparent in light of this disclosure and the following claims.

What is claimed is:

1. A method for sensing the state of a multi state of a NAND memory cell in a NAND array connected to a bit line, comprising the steps of:

applying a source bias at the memory cell at a constant gate voltage;

detecting a memory cell current, in response to the source bias voltage; and determining the NAND memory cell state corresponding to the memory cell current.

2. The method of claim 1 further comprising:

sending a signal in response to the memory cell current to a latch circuit with a sense node connected to the NAND array.

3. The method of claim 1, wherein the constant gate voltage is zero volts.

4. A circuit for sensing multi states of a NAND memory cell comprising of:

a NAND string of memory cells connected to an external bit line, wherein the memory cells are connected in series;

a source for varying a source bias at a memory cell at a constant gate voltage of 0v;

a sense node for sensing a memory cell current in response to the source bias; and a latch circuit to flip from a pre-conditioned state based upon a signal generated in response to the memory cell current.

* * * * *